(12) United States Patent
Golovato et al.

(10) Patent No.: US 6,695,318 B2
(45) Date of Patent: Feb. 24, 2004

(54) ELECTRONIC DEVICE PROCESSING EQUIPMENT HAVING CONTACT GASKET BETWEEN CHAMBER PARTS

(75) Inventors: Stephen N. Golovato, Austin, TX (US); Arthur H. Laflamme, Jr., Rowley, MA (US); Jay R. Wallace, Danvers, MA (US)

(73) Assignee: Tokyo Electron Limited, Tokyo (JP)

( * ) Notice: Subject to any disclaimer, the term of this patent is extended or adjusted under 35 U.S.C. 154(b) by 220 days.

(21) Appl. No.: 09/760,853

(22) Filed: Jan. 17, 2001

(65) Prior Publication Data

US 2002/0093148 A1 Jul. 18, 2002

(51) Int. Cl.⁷ ................................. F16J 15/02
(52) U.S. Cl. .................. 277/628; 277/644; 277/647; 118/733; 62/62; 62/78
(58) Field of Search .................. 277/531, 606, 277/626, 637, 639, 644; 118/733; 285/379; 62/62, 78

(56) References Cited

U.S. PATENT DOCUMENTS

| | | | | |
|---|---|---|---|---|
| 5,348,587 A | * | 9/1994 | Eichman et al. | 118/723 MP |
| 5,568,929 A | * | 10/1996 | Yoshinaga | |
| 5,655,795 A | * | 8/1997 | Strnad et al. | |
| 5,730,801 A | * | 3/1998 | Tepman et al. | |
| 5,861,060 A | * | 1/1999 | Maugans et al. | 118/50.1 |
| 6,273,478 B1 | * | 8/2001 | Benett et al. | |
| 6,371,530 B1 | * | 4/2002 | Sato et al. | |
| 6,442,950 B1 | * | 9/2002 | Tung | 62/62 |
| 2001/0035132 A1 | * | 11/2001 | Kent et al. | |

* cited by examiner

Primary Examiner—Anthony Knight
Assistant Examiner—E Peavey
(74) Attorney, Agent, or Firm—Oblon, Spivak, McClelland, Maier & Neustadt, P.C.

(57) ABSTRACT

An arrangement for improved thermal and/or electrical coupling between parts disposed in electronic device processing equipment is provided. In an illustrated embodiment, an improved coupling between a chamber liner and a chamber wall is provided which can be utilized in semiconductor processing equipment. The arrangement includes a compressible coupling or gasket which is compressed between a wedge ring and the chamber wall. The chamber liner is coupled to the wedge ring, so that the chamber liner is coupled to the chamber wall by way of the wedge ring and compressible coupling.

31 Claims, 1 Drawing Sheet

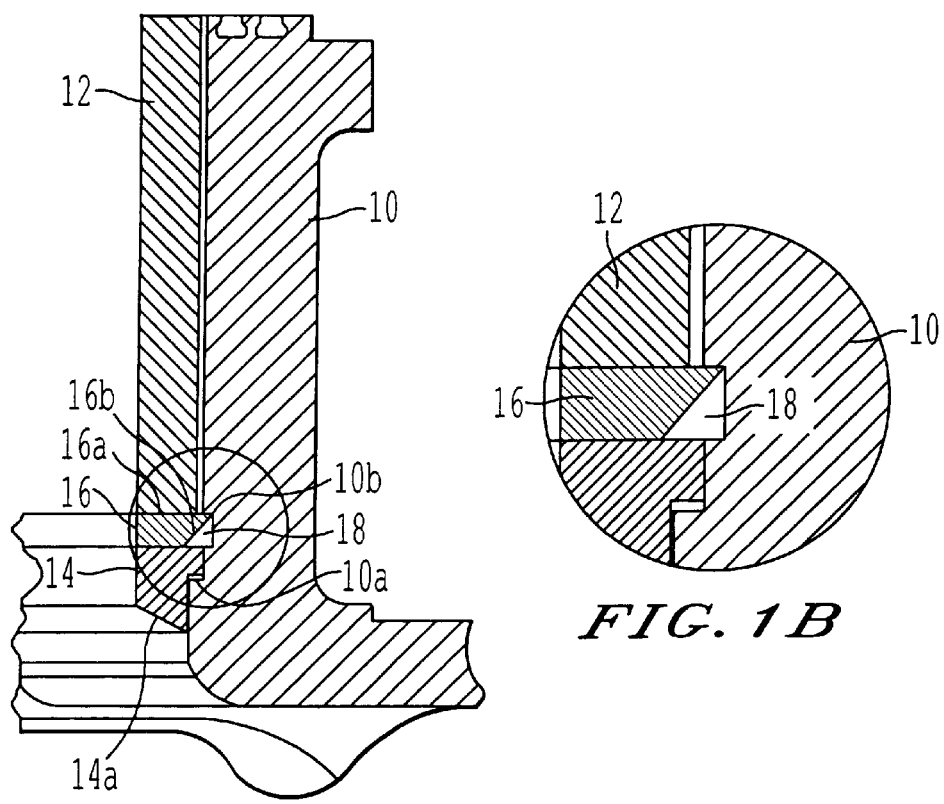
FIG. 1A
FIG. 1B
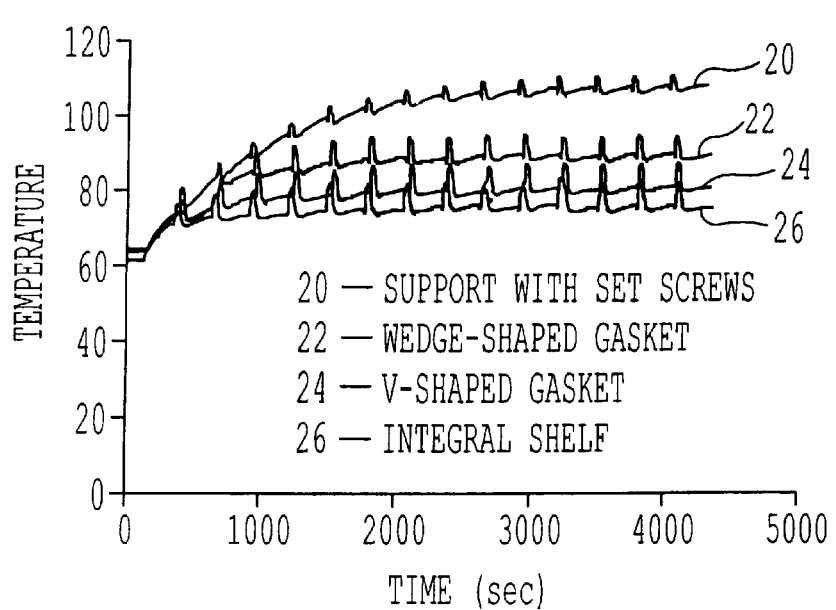
20 — SUPPORT WITH SET SCREWS
22 — WEDGE-SHAPED GASKET
24 — V-SHAPED GASKET
26 — INTEGRAL SHELF
FIG. 2 the chamber liner to the chamber wall is especially advantageous, as this ensures that the liner assumes the temperature of the chamber wall, and more particularly is cooled by the chamber wall (e.g., where the chamber wall is cooled by cooling channels defined therein). In this way, the invention enables good temperature control of the chamber liner with minimal addition of structure to the chamber liner assembly. Additionally, once assembled, the gasket arrangement provides for a very reliable coupling between the parts, with little risk of the coupling becoming inadvertently broken due to normal use or thermal cycling.

ELECTRONIC DEVICE PROCESSING EQUIPMENT HAVING CONTACT GASKET BETWEEN CHAMBER PARTS

FIELD OF THE INVENTION

The invention relates to processing equipment, and particularly to an arrangement which provides advantageous thermal and/or electrical contact between chamber parts inside of the processing equipment. In an illustrated embodiment, a wedge ring assembly couples a chamber liner of with a chamber wall in a semiconductor processing apparatus, so that the temperature of the liner more closely matches that of the chamber wall. The invention can also have applications to processing equipment other than semiconductor processing equipment, e.g., equipment utilized in manufacturing components for liquid crystal displays.

BACKGROUND OF THE INVENTION

Discussion of Background

Various types of processing equipment are utilized in the manufacture of electronic devices such as semiconductor devices or panels used in liquid crystal displays. For example, deposition equipment is utilized for depositing films or layers upon a semiconductor wafer. "Etchers" typically utilize a plasma to remove or etch portions of a film or layer from a wafer to form the desired features or devices upon the wafer. Due to the extremely small size of the features formed in semiconductor processing, the processing equipment must be carefully and precisely controlled. The equipment usually includes a "chamber" or enclosed region, within which the environment is controlled for optimal processing of the wafers. Typically, it is desirable to control the temperature and/or the electrical potential of parts disposed inside of the chamber or which define the chamber of the processing equipment. For example, a process chamber can include a chamber wall which is covered by a liner so that the liner can be periodically replaced (or removed for cleaning) without requiring replacement of the entire chamber wall. However, where it is desired to control the temperature or electrical state of the chamber, it can be difficult to provide an economical assembly which ensures good contact between the chamber wall and the chamber liner so that the chamber liner assumes the temperature and/or electrical condition of the chamber wall.

In order to ensure good coupling between the chamber wall and the chamber liner, the liner can be precisely manufactured to conform to the size and shape of the chamber wall and ensure good thermal and/or electrical contact. Alternately, the chamber wall can be designed to include an integral ledge or shelf region upon which the liner is seated, such that the seating arrangement of the liner and chamber wall ensures good thermal and/or electrical contact. However, such arrangements suffer from a number of shortcomings. For example, precisely machined parts can be extremely expensive and could nevertheless result in a poorly coupled assembly if the liner is deformed slightly during handling or use (e.g., due to thermal cycling) of the parts. Further, the provision of an integral ledge or shelf to serve as a contact seat for a chamber liner can increase the manufacturing complexity of the chamber wall. Moreover, the integral ledge solution is unacceptable on a retrofit basis where the chamber wall was originally manufactured without such a ledge or shelf. Accordingly, an arrangement is needed which provides for improved thermal and/or electrical contact between chamber parts in equipment for manufacturing electronic devices. Preferably such an arrangement is suitable for use as original equipment, but also could be utilized on a retrofit basis where a contact problem between chamber parts has been discovered.

SUMMARY OF THE INVENTION

The present invention provides an assembly which improves the thermal and/or electrical contact between chamber parts in equipment used for manufacturing electronic devices such as semiconductors. In a presently preferred form, a soft metal gasket is pressed between surfaces of chamber parts utilizing a wedge assembly. The gasket can have various forms as long as it ensures a reliable coupling between the chamber parts once assembled. In a presently preferred form, the gasket is a split ring having a V-shaped cross-section. The gasket has a dimension which is larger (before assembly of the parts) than the dimension or space between adjacent chamber parts which are to be coupled. However, the gasket is compressible so that once the parts are assembled, the gasket is compressed and coupling of the parts is ensured. In one preferred form of the invention, the gasket is inelastically compressed when the parts are assembled and a relatively permanent coupling is achieved upon assembly. Preferably, one of the parts of the wedge system includes an inclined surface which further assists in compressing the gasket between the parts upon assembly.

BRIEF DESCRIPTION OF THE DRAWINGS

A more complete understanding of the invention and many of the attendant advantages thereof will become apparent from the following detailed description, particularly when considered in conjunction with the accompanying drawings in which:

FIG. 1 is a cross-sectional view of an exemplary coupling arrangement of the invention utilized to couple a chamber liner to a chamber wall; and FIG. 2 is a graph comparing of the thermal performance of various chamber liner mounting arrangements.

DETAILED DESCRIPTION OF THE PREFERRED EMBODIMENTS

Referring to FIG. 1, a cross-section of an assembly in accordance with the invention is shown. The arrangement illustrated in FIG. 1 provides an advantageous coupling between a chamber liner and a chamber wall in semiconductor manufacturing equipment such as a plasma etcher. However, it is to be understood that various aspects of the invention could be advantageously utilized in other types of electronic device processing equipment, for example, deposition equipment utilized to manufacture semiconductor devices or panels for liquid crystal displays. It is also to be understood that, although the invention is described in the context of providing an advantageous coupling between the chamber liner and a chamber wall, the invention could also be utilized where it is desired to ensure thermal and/or electrical contact between other parts. For example, the use of a wedge member and a compressible gasket could be utilized for providing a good coupling of parts such as an exhaust baffle to a chamber wall or chamber liner. Accordingly, although the illustrated embodiment provides an advantageous coupling between a chamber liner and a chamber wall, it is to be understood that various aspects of the invention can have other applications. The invention is described herein as providing an advantageous thermal "and/or" electrical coupling since, for certain applications, one type of coupling might be more important than another. Thus, for certain applications, the thermal coupling of the parts might be more important, in other applications, the electrical coupling could be more important, and in still others, both properties could be extremely important.

The arrangement of FIG. 1 includes a chamber wall 10, which is covered by a liner 12 disposed radially inside of the chamber wall. Such a liner is often advantageously utilized to prevent wear and/or the accumulation of debris upon the chamber wall 10. For example, in an etcher having a parallel plate electrode arrangement, plasma and/or by-products from the plasma can contact the wall of the chamber. If the chamber is not lined, the chamber wall can be etched causing premature deterioration of the chamber. Even if the chamber wall is not etched, debris can accumulate upon the chamber wall. If this debris is not regularly cleaned, particles can be generated (as the debris is dislodged from the wall) which can result in the introduction of undesirable impurities onto the surface of the wafers being processed. Even if the chamber wall is regularly cleaned, this cleaning is problematic since it can be cumbersome and time consuming to clean the chamber wall inside of the semiconductor processing equipment, and such cleaning can also result in the undesirable generation of particles. These problems are avoided by utilizing a chamber liner, which prevents the plasma or plasma by-products from contacting the chamber wall, and the chamber liner can be periodically replaced with a clean liner. If the removed liner has not deteriorated, it can be cleaned after replacement, so that the cleaning does not delay resumed use of the chamber. Further, since the liner can be cleaned at a location remote from the chamber and clean room, the problem of particle generation during cleaning is avoided.

As is apparent from the discussion above, it is obviously preferable to utilize a chamber wall liner so that the chamber wall is not directly exposed to the interior of the chamber. However, one difficulty which can arise with the use of a chamber liner is that, if the chamber liner is not properly coupled to the chamber wall, the liner can have a different thermal or electrical condition than the chamber wall. Often, the temperature of the chamber wall is controlled so that the chamber does not become too hot or too cold. If the chamber liner is not properly coupled to the chamber wall, the temperature control suffers and the chamber liner can have a temperature which is different from that of the chamber wall. Further, if the chamber liner is not adequately electrically coupled to the chamber wall, the performance of the chamber can suffer. For example, in certain plasma etcher configurations, the upper electrode and chamber wall are grounded, and the chamber wall and upper electrode together act as the ground electrode. If a chamber liner is used and the liner is not effectively coupled to the chamber wall, the liner is not properly grounded and the performance of the etcher suffers. Further, regardless of whether the chamber wall is to be coupled to the plasma, if the chamber liner is not properly coupled to the chamber wall, charges can accumulate, which can lead to undesirable conditions such as arcing.

In a prior arrangement, to ensure coupling of the liner to the chamber wall, the chamber wall has been formed with a ledge or shelf upon which the lower surface of the chamber liner is seated. With this arrangement, the seating of the chamber liner upon the shelf thermally and electrically couples the chamber liner to the chamber wall. However, as discussed earlier, such an arrangement increases the complexity of the chamber wall design. Moreover, if the chamber wall was manufactured without such a ledge or shelf, there has been no reliable and economical manner to couple the chamber liner and chamber wall while ensuring adequate thermal and electrical coupling of the chamber wall and chamber liner. For example, where the chamber wall and liner have been connected utilizing fasteners, an unsatisfactory coupling has resulted. To improve the coupling, the liner can be manufactured to more closely match the dimensions of the chamber wall, with much stricter manufacturing tolerances, to increase the contact between the wall and liner. However, such modifications can significantly increase the cost of the chamber liner, and may nevertheless result in insufficient coupling if the liner should be deformed slightly in handling or use.

In accordance with the invention, a wedge and gasket coupling arrangement is provided to improve the thermal and/or electrical coupling of the chamber liner and chamber wall. The arrangement of FIG. 1 includes a wedge support ring 14, above which is disposed a wedge ring 16. The wedge ring 16 includes an upper surface 16a, upon which the chamber liner 12 is disposed so that the liner 12 is coupled to the wedge ring 16. To ensure adequate thermal and/or electrical coupling of the wedge ring to the chamber wall (and thus between the chamber liner and the chamber wall), a compressible coupling 18 is provided between the wedge ring 16 and chamber wall 10. In the embodiment of FIG. 1, the compressible coupling 18 is in the form of a split ring gasket having a V-shaped cross-section. However, other forms are also possible including, for example, a hollow circular or oval shaped ring, or a C-shaped split ring. The compressible coupling could also be solid (rather than a hollow or split ring), however, as discussed later herein with reference to FIG. 2, the performance of a split ring gasket was found to be superior to that of a solid gasket. The use of a V-shaped split ring configuration is presently preferred, since this arrangement has been found capable of accommodating a greater range of variation in dimensions.

In a presently preferred form, the gasket 18 is formed of a soft aluminum, such as an 1100 series aluminum, however, other materials are also possible. Such materials could include a soft copper, indium, or other materials, depending upon the application. The lateral dimension of the gasket prior to assembly is preferably larger than the space between the wedge ring 16 and the chamber wall 10 once assembled. However, the cross-sectional dimension (i.e., the sum of the dimensions in the lateral direction, excluding hollow portions) of the gasket 18 is also preferably smaller than the space between the wedge ring 16 and the chamber wall 10, so that the gasket 18 can be compressed upon assembly of the part and, once assembled, the gasket provides a bridge or coupling between the chamber wall 10 and the wedge ring 16.

With a material such as a soft aluminum material, the wedge ring can inelastically or plastically deform to provide a reliable thermal and electrical coupling between the parts. Such an inelastic or plastic deformation is suitable since the gasket of the coupling assembly need only be a single-use gasket. In particular, with the arrangement of FIG. 1, the wedge ring and wedge support ring will typically not need to be removed for cleaning or replacement. For example, in one chamber arrangement in which the present invention can be utilized, a baffle plate structure is disposed within the processing chamber at a location above the wedge ring and wedge support ring. As a result, the wedge ring and wedge support ring are not exposed to the interior of the processing chamber (they are in the exhaust region), such that the wedge ring 16 and wedge support ring 14 need not be replaced when the chamber liner 12 is replaced or removed for cleaning. Thus, the gasket and wedge ring assembly can be installed once and typically will not require removal or replacement. However, it is to be understood that the invention could also be advantageously utilized in arrangements in which the parts are disposed such that they must be periodically removed for cleaning or replacement. In such instances, it could be desirable to utilize a gasket in which the deformation upon assembly is at least partially elastic so that the gasket can be reused. Alternatively, even if the gasket deforms plastically and disassembly/reassembly is required, the gasket could be expanded after disassembly, such that when it is reassembled, it is again compressed to ensure the desired coupling arrangement. Of course, a new replacement gasket could also be utilized upon disassembly/reassembly of the wedge ring assembly.

Still referring to FIG. 1, the chamber wall 10 can include a ledge or shelf 10a which assists in positioning of the wedge support ring 14. However, such a ledge or shelf 10a is optional. If utilized, this ledge or shelf 10a is primarily for positioning, and thus, need not be manufactured to the size or precision needed, for example, to ensure electrical or thermal coupling between the parts, since the thermal and/or electrical coupling is ensured by the wedge ring and gasket in the arrangement of the invention.

The chamber wall 10 can also be provided with a recess 10b, within which the gasket 18 can be positioned. Further, the wedge ring 16 preferably has an inclined surface 16b which, when assembled, is adjacent to the gasket 18. This inclined surface 16b assists in urging the gasket 18 toward the chamber wall 10 such that the gasket 18 is compressed between the wedge ring 16 and the chamber wall 10. Although the wedge member 16 preferably has an inclined surface 16b, such an inclined surface is not required, and the preferred shape of the wedge member 16 could vary depending upon the shape of the compressible coupling or gasket 18. As shown in FIG. 1, the wedge support ring 14 can have a tapered lower surface 14a. This tapered surface 14a is also optional, but is preferred to avoid the presence of sharp or square corners, which can be undesirable in semiconductor processing equipment.

In assembling the arrangement of FIG. 1, the wedge support ring is first placed inside of the chamber, with the position of the wedge support ring 14 determined by the location of the shelf 10a. As noted earlier, the ledge or shelf 10a is optional and the wedge support ring 14 can be positioned within the chamber without utilizing such a ledge or shelf arrangement. The gasket 18 is then placed inside of the chamber at a location above the wedge support ring. In the arrangement of FIG. 1, the gasket 18 is placed inside of the recess 10b of the chamber wall so that the gasket 18 is disposed inside of the recess 10b and projects radially inwardly from the recess 10b. The wedge ring 16 is then placed upon the wedge support ring 14. In placing the wedge ring 16 upon the wedge support ring 14, the gasket 18 is compressed between the wedge ring 16 and the chamber wall 10, to thereby ensure thermal and electrical coupling between the wedge ring 16 and the chamber wall 10. The inclined surface 16b of the wedge ring 16 presents an inclined plane to the gasket to compress the gasket as the wedge ring is moved toward and in to contact with the wedge support ring 14. Since the gasket 18 is compressed against the chamber wall as the wedge ring and wedge support ring are squeezed together, the assembled structure is securely fixed in place, even if positioning structures such as the shelf 10a are not utilized. Thus, the force exerted as the gasket 18 is wedged between the wedge ring 16 and the chamber wall 10 can also be beneficial in holding the assembly in place.

In a presently preferred form of the invention, the wedge support ring 14 includes threaded apertures and the wedge ring includes a like number of apertures which are not threaded. Fasteners such as bolts or screws pass through the apertures of the wedge ring and are received by the threaded apertures of the wedge support ring. Once these fasteners are tightened, the gasket is fixed in place and the wedge ring 16 is coupled to the chamber via the gasket 18. Once the wedge support 14, gasket 18 and wedge ring 16 are assembled, the upper surface 16a of the wedge ring provides a shelf upon which the chamber liner 12 can be reliably seated so that the liner 12 is thermally and electrically coupled to the chamber wall 10 via the wedge ring 16 and the gasket 18.

The upper surface of the wedge ring 16 can include threaded apertures so that fasteners which extend through the chamber liner 12 can be received by the threaded apertures of the wedge ring to fasten the chamber liner to the wedge ring. By way of example, in one form of the invention, the wedge ring can include alternating threaded and non-threaded apertures disposed about the ring. The non-threaded apertures of the wedge ring receive fasteners which extend through the wedge ring and into the threaded apertures of the wedge support ring. The threaded apertures receive fasteners which extend through the chamber liner and into the wedge ring. It is to be understood that other fastening expedients (e.g., a clamping arrangement) are also possible. The parts could also be unfastened if desired with, for example, the chamber lid urging the parts together when the lid is closed.

FIG. 2 illustrates the advantageous performance achieved by the invention in terms of thermal coupling the chamber liner and chamber wall. In the graph of FIG. 2, the chamber wall was maintained at a temperature of 60° C. Ideally, the chamber liner would also have this temperature. Thus, the data reflecting liner temperatures closer to that of the chamber wall (60° C.) are more desirable. The top line 20 of FIG. 2, representing the least desirable data, corresponds to an arrangement in which the chamber liner is fastened to the chamber wall utilizing set screws. As is apparent, the chamber liner temperature was substantially above that of the chamber wall, indicating that the thermal coupling between the chamber liner and the chamber wall was poor. The data of the second line 22 represents an arrangement in accordance with the invention as shown in FIG. 1, except that, rather than utilizing the preferred split ring or V-shaped gasket, a solid wedge-shaped gasket (having a triangular cross-section) was utilized. Such a wedge-shaped gasket was believed to perform worse than the preferred split ring gasket of the invention (line 24 of FIG. 2), since the wedge-shaped gasket cannot be as readily compressed to ensure a reliable, effective thermal coupling between the chamber wall and the chamber liner. However, as is also apparent from FIG. 2, even utilizing this wedge-shaped gasket, the performance was superior to the set screw coupling of the chamber liner to the chamber wall shown by line 20.

The lowest line 26, showing the best results, corresponds to an assembly in which the chamber wall is formed with an integral shelf upon which the chamber liner is seated. The second line from the bottom 24 corresponds to the arrangement of the invention as shown in FIG. 1 in which a V-shaped gasket is utilized. Thus, as shown by the data of FIG. 2, the preferred form of the invention results in a thermal coupling arrangement which is quite similar to that obtained by utilizing a direct coupling of the chamber liner to a chamber wall utilizing an integrally formed shelf in the chamber wall. As discussed earlier, the arrangement of the invention is advantageous in that a shelf seat for the chamber liner need not be integrally formed with the chamber wall, and the arrangement of the invention can be provided in a chamber on a retrofit basis.

The peaks shown in the various lines of FIG. 2 do not represent the liner temperature, but rather, represent transient heating of the thermal couple. The liner temperature measurements for each of the four cases of FIG. 2 were taken for a series of 15 wafers, with each wafer etched for four minutes each. This provided a sufficient amount of time for each liner to reach a steady-state condition.

Although the illustrated arrangement includes a wedge ring, wedge support ring and gasket with the chamber liner disposed above the wedge ring, it is to be understood that a number of variations are possible. For example, the wedge ring could be eliminated with the chamber liner urging the gasket against the chamber wall upon fastening of the chamber liner to the wedge support ring or another support within the chamber, and the chamber liner could be provided with a tapered or inclined surface to further assist this compression coupling. However, the use of a separate wedge ring is presently preferred so the gasket need not be loaded and unloaded each time the chamber liner is replaced. Thus, particularly where the gasket is a single use gasket and is inelastically deformed upon assembly, the use of a separate wedge ring is preferred, since the gasket need not be replaced (or refurbished) each time the chamber liner is replaced. Thus, although the chamber liner assembly illustrated in FIG. 1 includes the chamber liner, wedge ring, and wedge support ring, it is to be understood that a greater or lesser number of parts could be utilized by combining or separating certain elements into a different number of discreet parts or elements. Further, it is to be understood that the shapes of the various parts could also differ. For example, while the wedge member 16 and compressible coupling 18 are provided in the form of complete ring members which extend about the periphery of the chamber, these elements could be other shapes, or could be rings which do not extend about the entire chamber periphery. In addition, as noted earlier, although the illustrated embodiment provides a coupling between a first chamber part in the form of a chamber liner and a second chamber part in the form of a chamber wall, the invention could be advantageously applied where it is desired to couple other types of first and second chamber parts (or more than two chamber parts) for improved thermal and/or electrical contact.

Obviously, numerous modifications and variations of the present invention are possible in light of the above teachings. It is therefore to be understood that, within the scope of the appended claims, the invention may be practiced otherwise and as specifically described herein.

What is claimed as new and desired to be secured by Letters Patent of the United States is:

1. An electronic device processing apparatus comprising:
   (a) a process chamber within which workpieces are processed, said process chamber including a chamber wall;
   (b) a chamber liner assembly disposed radially on an inner wall of the chamber wall in order to prevent at least one of wear or accumulation of debris upon the chamber wall;
   (c) a compressible coupling disposed between said inner wall and said chamber liner assembly.

2. An electronic device processing apparatus as recited in claim 1, wherein said compressible coupling is formed of an electrically conductive material.

3. An electronic device processing apparatus as recited in claim 1, wherein said compressible coupling is formed of a thermally conductive material.

4. An electronic device processing apparatus as recited in claim 1, wherein said chamber liner assembly comprises:
   (i) a chamber liner; and
   (ii) a ring assembly;
   wherein said chamber liner is disposed above and in contact with said ring assembly, and further wherein said compressible coupling is disposed between said ring assembly and said chamber wall.

5. An electronic device processing apparatus as recited in claim 4, wherein said ring assembly includes a first ring and a second ring, wherein said first ring is disposed above and in contact with said second ring, wherein said first ring is in contact with said chamber liner.

6. An electronic device processing apparatus as recited in claim 5, wherein said compressible coupling is disposed between said first ring and said chamber wall.

7. An electronic device processing apparatus as recited in claim 6, wherein said chamber wall includes a ledge which receives said second liner.

8. An electronic device processing apparatus as recited in claim 5, wherein said first ring is fastened to said second ring.

9. An electronic device processing apparatus as recited in claim 8, wherein said chamber liner is fastened to said first ring.

10. An electronic device processing apparatus as recited in claim 4, wherein said compressible coupling is inelastically deformed upon assembly as said compressible coupling is compressed between said ring assembly and said chamber wall.

11. An electronic device processing apparatus as recited in claim 4, wherein said compressible coupling is a split ring.

12. An electronic device processing apparatus as recited in claim 4, further including a groove disposed in at least one of said chamber wall and said ring assembly, and wherein said compressible coupling is disposed in said groove.

13. An electronic device processing apparatus as recited in claim 1, wherein said compressible coupling has a cross-sectional area smaller than an area of a space between said chamber liner assembly and said chamber wall.

14. An electronic device processing apparatus as recited in claim 13, further including a groove disposed in at least one of said chamber wall and said ring assembly, and wherein said compressible coupling is disposed in said groove.

15. An electronic device processing apparatus as recited in claim 1, further including a groove disposed in at least one of said chamber wall and said ring assembly, and wherein said compressible coupling is disposed in said groove.

16. An electronic device processing apparatus as recited in claim 1, wherein said compressible coupling has a V-shaped cross-section.

17. An electronic device processing apparatus as recited in claim 1, wherein said chamber liner assembly includes an inclined surface disposed adjacent to said compressible coupling.

18. An electronic device processing apparatus as recited in claim 17, wherein said chamber liner assembly includes a wedge ring having an upper surface, wherein said chamber liner is disposed on said upper surface and said compressible coupling is disposed between said wedge ring and said chamber wall, and further wherein said wedge ring includes said inclined surface and said inclined surfaces compresses said compressible coupling between said wedge ring and said chamber wall.

19. An electronic device processing apparatus as recited in claim 18, wherein said compressible coupling is inelastically deformed upon compression between said wedge ring and said chamber wall.

20. An electronic device processing apparatus having a chamber within which electronic devices are processed, said electronic device processing apparatus comprising:
(a) a first chamber part;
(b) a second chamber part including an inner wall;
(c) a coupling arrangement for coupling said first chamber part to said second chamber part, said coupling arrangement including:
(i) a compressible coupling; and
(ii) an inclined surface positioned adjacent to said compressible coupling, wherein said compressible coupling is compressed between said inclined surface and said inner wall.

21. An electronic device processing apparatus as recited in claim 20, wherein said compressible coupling is inelastically compressed between said inclined surface and said second chamber part.

22. An electronic device processing apparatus as recited in claim 20, wherein said second chamber part includes a recess which receives said compressible coupling.

23. An electronic device processing apparatus as recited in claim 20, wherein said coupling arrangement includes a wedge member having said inclined surface disposed thereon, said wedge member including a contact surface which contacts said first chamber part such that said first chamber part is coupled to said second chamber part by said wedge member and said compressible coupling.

24. An electronic device processing apparatus as recited in claim 23, wherein said second chamber part includes a recess within which said compressible coupling is disposed.

25. An electronic device processing apparatus as recited in claim 24, further including a support member for supporting said wedge member.

26. An electronic device processing apparatus as recited in claim 23, wherein said first chamber part is a chamber liner and said second chamber part is a chamber wall.

27. An electronic device processing apparatus as recited in claim 26, wherein said compressible coupling is inelastically compressed between said wedge member and said chamber wall.

28. An electronic device processing apparatus as recited in claim 27, further including a wedge support ring which is disposed below said wedge member and which supports said wedge member.

29. An electronic device processing apparatus as recited in claim 28, said chamber wall includes a recess within which said compressible coupling is disposed.

30. An electronic device processing apparatus as recited in claim 29, wherein said compressible coupling has a split ring cross-section.

31. An electronic device processing apparatus as recited in claim 30, wherein said compressible coupling has a V-shaped cross-section.

* * * * *